(12) United States Patent
Luo et al.

(10) Patent No.: US 11,650,251 B2
(45) Date of Patent: May 16, 2023

(54) CHIP FOR DETECTION OF BASIC ELECTRIC LEAKAGE ON RESIDUAL CURRENT PROTECTOR

(71) Applicant: Zhejiang University, Zhejiang (CN)

(72) Inventors: Jiangcheng Luo, Hangzhou (CN); Yan Han, Hangzhou (CN)

(73) Assignee: Zhejiang University, Hangzhou (CN)

( * ) Notice: Subject to any disclaimer, the term of this patent is extended or adjusted under 35 U.S.C. 154(b) by 51 days.

(21) Appl. No.: 17/152,790

(22) Filed: Jan. 20, 2021

(65) Prior Publication Data

US 2021/0223316 A1 Jul. 22, 2021

(30) Foreign Application Priority Data

Jan. 20, 2020 (CN) .......................... 202010067885.2

(51) Int. Cl.
*G01R 31/327* (2006.01)

(52) U.S. Cl.
CPC ................................ *G01R 31/3277* (2013.01)

(58) Field of Classification Search
CPC .... G01R 19/25; G01R 19/04; G01R 19/2506; G01R 29/04; G01R 31/52; G01R 23/09; G01R 31/327; G01R 31/3277; H02H 3/05; H02H 3/33; H03K 5/1532
See application file for complete search history.

(56) References Cited

U.S. PATENT DOCUMENTS

| 7,301,330 | B2 * | 11/2007 | Van Oevelen | ........... | G01D 3/02 |
| | | | | | 324/207.21 |
| 2008/0197713 | A1 * | 8/2008 | Jin | ........................ | H02J 50/70 |
| | | | | | 307/104 |

FOREIGN PATENT DOCUMENTS

| CN | 104300494 A | * | 1/2015 |
| JP | 2016146700 A | * | 8/2016 |

* cited by examiner

*Primary Examiner* — Son T Le
(74) *Attorney, Agent, or Firm* — Bochner IP, PLLC; Andrew D. Bochner

(57) ABSTRACT

Disclosed is a chip for detection of basic electric leakage on a residual current protector. Basic electric leakage can be understood as an electric leakage signal which is generated during normal operation of an electrical appliance and cannot cause a residual current protector to trip out. The chip for detection of basic electric leakage includes a peak detection circuit, a 20 ms clock generator, a 60 ms delay circuit, a 2.5 V reference voltage module, a register module, a comparator module, a counter, a digital subtractor, an analog-to-digital converter (ADC) module, a digital-to-analog converter (DAC) module, an analog adder/analog subtractor, a selection circuit, and a circuit for delayed resetting. The present disclosure can identify and eliminate a basic electric leakage signal from an input electric leakage signal, and will not affect normal operation of a load during detection, determination, storage, and output of the electric leakage signal.

4 Claims, 1 Drawing Sheet

CHIP FOR DETECTION OF BASIC ELECTRIC LEAKAGE ON RESIDUAL CURRENT PROTECTOR

TECHNICAL FIELD

The present disclosure relates to the field of integrated circuit design, in particular to a chip for detection of basic electric leakage on a residual current protector.

BACKGROUND

The increasing popularity of electrical appliances causes the diversification and complexity of loads of a power grid. Therefore, more and more national and social attention has been paid to the safety in electricity use. Residual current protectors as auxiliary electrical appliances have become increasingly important in production and life. There is mainly capacitive electric leakage, resistive electric leakage, and short-circuit electric leakage of the electrical appliances. The capacitive electric leakage and the resistive electric leakage will last for a long time during the operation of the electrical appliances without making the residual current protectors operate, thus being called basic electric leakage. However, the presence of the basic electric leakage can cause the residual current protectors to trip out frequently. This will bring much inconvenience to the production and life of people. In view of this, it is necessary to find a way to prevent the basic electric leakage from causing the residual current protectors to trip out frequently.

SUMMARY

To overcome the shortcoming of the prior art, the present disclosure provides a chip for detection of basic electric leakage on a residual current protector.

The chip for detection of basic electric leakage on a residual current protector includes: a peak detection circuit used to detect a peak of an input electric leakage signal;

a 20 ms clock generator used to provide a clock for a counter and a delay circuit and provide an enable signal for an analog-to-digital converter (ADC) module;

a 60 ms delay circuit used for determination and output of a delayed residual current protector to improve accuracy in signal identification;

a 2.5 V reference voltage module used to provide a reference voltage for an ADC, a digital-to-analog converter (DAC), an analog adder, and an analog subtractor;

a counter module used to generate an enable signal for update of a register module;

a circuit used for delayed resetting of the counter after the enable signal output from the counter is effective;

the register module used to store a valve obtained by means of conversion of the ADC module:

a first digital comparator used to determine whether a value of the electric leakage signal is greater than a threshold value;

a second digital comparator used to monitor whether the electric leakage signal is in a positive half cycle or a negative half cycle;

a selection circuit used to select whether the analog adder or the analog subtractor operates according to a result obtained by the second digital comparator;

a digital subtractor used to determine and output an enable signal to make the counter operate;

the ADC module used to convert an analog peak signal of an input basic electric leakage signal into a digital signal and store the digital signal in the register module;

a DAC module used to convert the digital signal in the register module into an analog signal and output the analog signal to the analog adder, the analog subtractor, and the corresponding digital comparator; and the analog adder/the analog subtractor used to perform addition/subtraction on the input electric leakage signal and the analog signal obtained by means of conversion of the DAC and then output an obtained value to the residual current protector.

The digital subtractor may be used to perform the subtraction on a value converted from the peak of the input electric leakage signal by the ADC module and a value, originally stored in a register A, of the basic electric leakage signal, and an obtained flag bit result may serve as the enable signal of the counter.

The counter may be used to determine whether a peak of a current input electric leakage signal is no less than the value, stored in the register A, of the basic electric leakage signal throughout three cycles (60 ms); if so, the peak of the current electric leakage signal may be stored in the register as a new value of the basic electric leakage signal for update; and if not, the peak of the current input electric leakage signal may be stored in the register A within one cycle for update.

The analog subtractor and the analog adder may be selected to operate in the positive half cycle of a waveform and in the negative half cycle of the waveform, respectively, and an input signal and a signal after DAC conversion (in the register) are processed by the analog adder and the analog subtractor and then output to the residual current protector.

A residual current protector is provided with the chip for detection of basic electric leakage.

The present disclosure has the following beneficial effects: the basic electric leakage can be automatically identified without affecting operation of the residual current protector, and the value of the basic electric leakage signal can be stored; if the value of the basic electric leakage signal is greater than the preset threshold value, the input electric leakage signal is directly output to the residual current protector; and if the value of the basic electric leakage is not greater than the preset threshold value, and the basic electric leakage signal is eliminated from the input electric leakage signal, and then output to the residual current protector. Furthermore, the present disclosure has high practical application value and market value.

DETAILED DESCRIPTION

The present disclosure is described below with reference to the accompanying drawings and embodiments.

Figure 1:
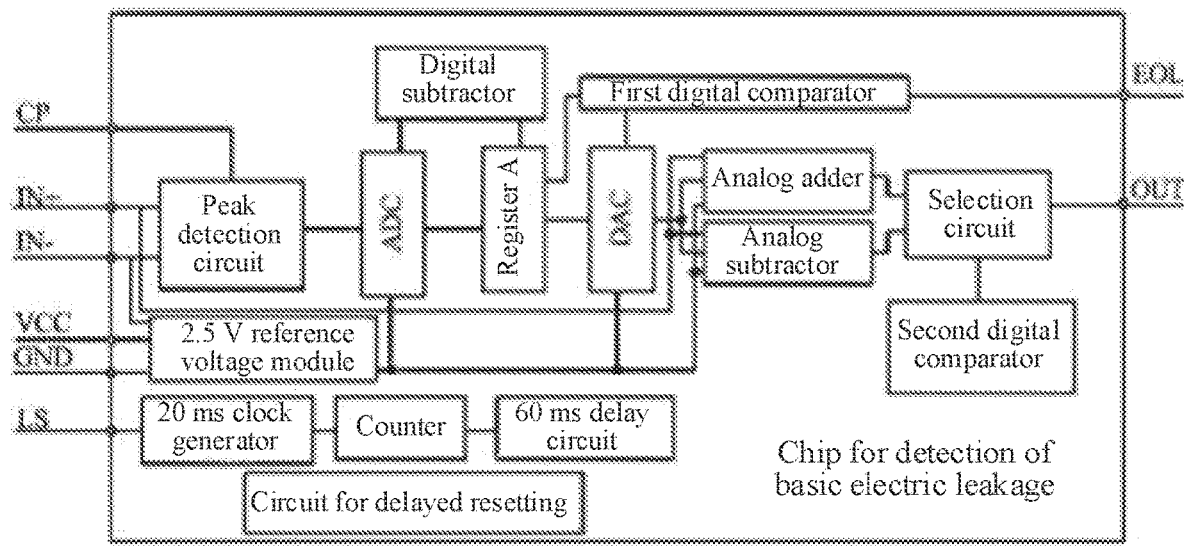
FIG. 1 is a structural diagram of a chip for detection of basic electric leakage.

As shown in FIG. 1, a chip for detection of basic electric leakage includes:

a peak detection circuit used to detect a peak of an input electric leakage signal;

a 20 ms clock generator used to provide a clock for a counter and a delay circuit and provide an enable signal for an analog-to-digital converter (ADC) module;

a 60 ms delay circuit used for determination and output of a delayed residual current protector to improve accuracy in signal identification:

a 2.5 V reference voltage module used to provide a reference voltage for an ADC, a digital-to-analog converter (DAC), an analog adder, and an analog subtractor;

a counter module used to generate an enable signal for update of a register module:

a circuit used for delayed resetting of the counter after the enable signal output from the counter is effective;

the register module used to store a valve obtained by means of conversion of the ADC module;

a first digital comparator used to determine whether a value of the electric leakage signal is greater than a threshold value;

a second digital comparator used to monitor whether the electric leakage signal is in a positive half cycle or a negative half cycle:

a selection circuit used to select whether the analog adder or the analog subtractor operates according to a result obtained by the second digital comparator:

a digital subtractor used to determine and output an enable signal to make the counter operate:

the ADC module used to convert an analog peak signal of an input basic electric leakage signal into a digital signal and store the digital signal in the register module:

the DAC module used to convert the digital signal in the register module into an analog signal and output the analog signal to the analog adder, the analog subtractor, and the digital comparators; and the analog adder/the analog subtractor used to perform addition/subtraction on the input electric leakage signal and the analog signal obtained by means of conversion of the DAC, and then output an obtained value to a residual current protector.

Figure 2:
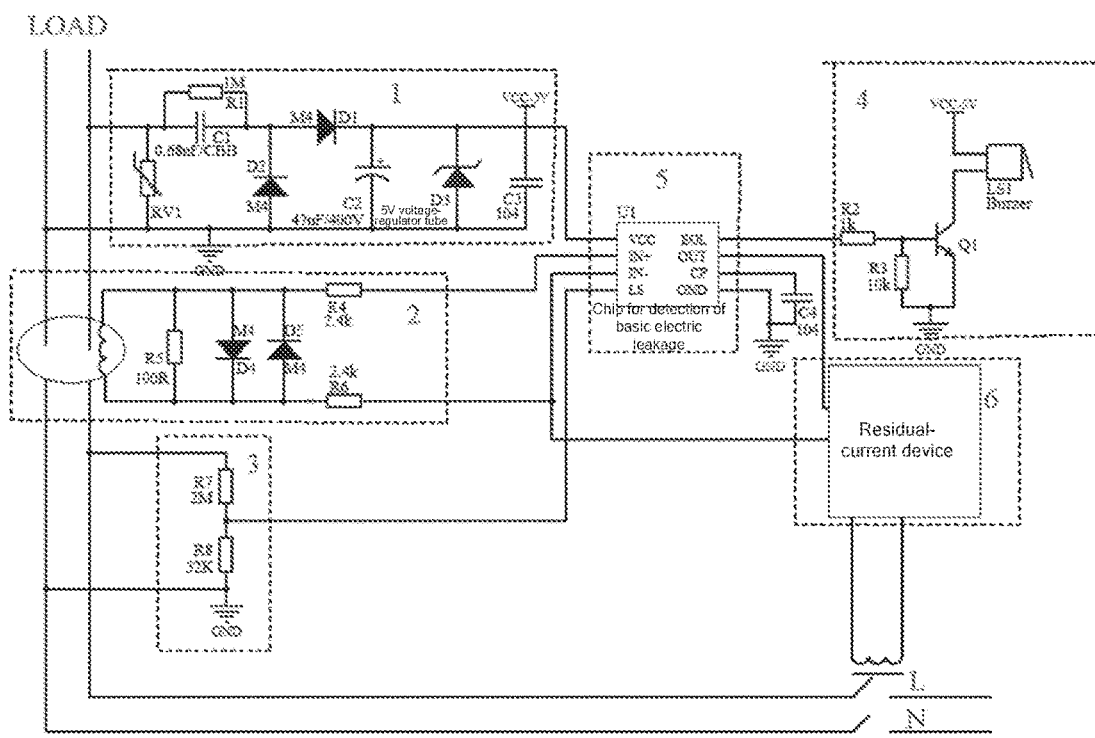
FIG. 2 is an application circuit diagram of the chip for detection of basic electric leakage of the present disclosure.

FIG. 2 shows an application circuit diagram of the chip for detection of basic electric leakage of the present disclosure. An application circuit includes:

a power supply circuit 1, used to supply a 5 V voltage to a chip 5 for detection of basic electric leakage, the residual current protector 6, and the alarm circuit 4;

a circuit 2 for generating an electric leakage signal, used to convert a magnetic ring generation signal into a voltage signal and input the voltage signal to the chip 5 for detection of basic electric leakage for identification;

a voltage division circuit 3, used to provide a signal at a stable frequency of 50 Hz to the chip 5 for detection of basic electric leakage, so as to generate a 20 ms clock;

the alarm circuit 4, used to operate if a value, stored in the chip 5 for detection of basic electric leakage, of the basic electric leakage signal is greater than the preset threshold value, so as to generate a sound of a buzzer;

the chip 5 for detection of basic electric leakage, used to eliminate the basic electric leakage signal from a signal input to the circuit 2 for generating the electric leakage signal and then output the signal input to the circuit 2 to the residual current protector 6;

the residual current protector 6, used to receive the signal output from the chip 5 for detection of basic electric leakage to determine whether trip-out occurs.

As shown in FIG. 2, after the chip 5 for detection of basic electric leakage is powered on, a mains supply having a voltage divided by the voltage division circuit 3 is input to the chip 5 for detection of basic electric leakage, so as to provide an accurate 20 ms clock signal. When no electric leakage signal is generated, a difference value of a signal output from the chip 5 for detection of basic electric leakage via an OUT port and a signal input to the chip 5 for detection of basic electric leakage via IN− is equal to 0. When a peak generated in the circuit 2 for generating the electric leakage signal is no less than a value in a register A in the chip 5 for detection of basic electric leakage, a value of a signal output to the residual current protector 6 within three cycles of 60 ms is equal to a value obtained by subtracting the value stored in the register in the chip 5 for detection of basic electric leakage from a value of a signal input to the chip 5 for detection of basic electric leakage; if the residual current protector does not operate within the three cycles of 60 ms, current electric leakage is regarded as the basic electric leakage, and a basic electric leakage signal is stored in the register for update. On the contrary, when the peak generated in the circuit 2 for generating the electric leakage signal is less than the value in the register in the chip 5 for detection of basic electric leakage, this signal is stored in the register A within one cycle of 20 ms for update. When the value in the register in the chip 5 for detection of basic electric leakage is greater than the preset threshold value, a high level is output to turn on the alarm circuit while the register is reset.

The operating process of the chip for detection of basic electric leakage is described in detail below.

As shown in FIG. 1, after the chip is powered on, the register A is reset, and the reference voltage module generates a 2.5 V stable voltage; and this 2.5 V voltage reference is used to increase an overall potential in the chip by 2.5 V, so as to avoid waveform distortion; after voltage division, the AC signal of 50 HZ of the mains supply is input to the 20 ms clock generator via an LS port, so as to generate the 20 ms clock signal as a standard system clock in the chip. A peak of a signal input via IN+ or IN− is obtained by the peak detection circuit, then this signal is converted into a digital signal by the ADC module, and whether the counter needs to be enabled is determined according to the difference between a value of the digital signal and the value in the register A. Once the counter is enabled, determination for 60 ms is performed. The signal input via IN+ is added to/subtracted from the signal, obtained by means of the conversion of the DAC, in the register A, and is output in real time to the residual current protector 6 via the OUT port. If the residual current protector does not operate, a current electric leakage signal is regarded to indicate the basic electric leakage and is stored in the register A; and then the counter is reset by the circuit for the delayed resetting. The input peak signal is converted into the digital signal by the ADC; and if the difference between the value of the digital signal and the value in the register A is less than zero, the value obtained by means of the conversion of the ADC is directly stored in the register A for update. If the value, stored in the register A. of the basic electric leakage signal is greater than the preset threshold value, the register A is reset, and the signal is output to an external circuit via an EOL port to fulfill an alarm.

What is claimed is:

1. A chip for detection of basic electric leakage on a residual current protector, comprising:
   a peak detection circuit configured to detect a peak of an input electric leakage signal;
   a 20 ms clock generator configured to provide a clock for a counter and a delay circuit and provide an enable signal for an analog-to-digital converter (ADC) module;
   a 60 ms delay circuit configured for determination and output of a delayed residual current protector to improve accuracy in signal identification;

a 2.5 V reference voltage module configured to provide a reference voltage for an ADC, a digital-to-analog converter (DAC), an analog adder, and an analog subtractor;

a counter module configured to generate an enable signal for update of a register module;

a circuit configured for delayed resetting of the counter after the enable signal output from the counter is effective;

the register module configured to store a valve obtained by conversion of the ADC module;

a first digital comparator configured to determine whether a value of the electric leakage signal is greater than a threshold value;

a second digital comparator configured to monitor whether the electric leakage signal is in a positive half cycle or a negative half cycle;

a selection circuit configured to select whether the analog adder or the analog subtractor operates according to a result obtained by the second digital comparator;

a digital subtractor configured to determine and output an enable signal to make the counter operate;

the ADC module configured to convert an analog peak signal of an input basic electric leakage signal into a digital signal and store the digital signal in the register module;

a DAC module configured to convert the digital signal in the register module into an analog signal and output the analog signal to the analog adder, the analog subtractor, and the first digital comparator; and the analog adder/the analog subtractor configured to perform addition/subtraction on the input electric leakage signal and the analog signal obtained by means of conversion of the DAC and then output an obtained value to the residual current protector.

2. The chip for detection of basic electric leakage according to claim 1, wherein the digital subtractor is configured to perform subtraction on a value of the digital signal converted from the peak of the input electric leakage signal by the ADC module and a value in a register A, and an obtained flag bit result serves as the enable signal of the counter.

3. The chip for detection of basic electric leakage according to claim 1, wherein the counter is configured to determine whether a peak of a current input electric leakage signal is no less than the value in the register A throughout three cycles of 60 ms; if so, the peak of the current electric leakage signal is stored in the register A as a new value of the basic electric leakage signal for update; and if not, the peak of the current input electric leakage signal is stored in the register A within one cycle of 20 ms for update.

4. The chip for detection of basic electric leakage according to claim 1, wherein the analog subtractor and the analog adder are configured to operate in the positive half cycle of a waveform and in the negative half cycle of the waveform, respectively, and an input signal and a signal after DAC conversion are processed by the analog adder and the analog subtractor and then output to the residual current protector.

* * * * *